United States Patent [19]

Reichart

[11] 4,268,798
[45] May 19, 1981

[54] HIGH PERFORMANCE SUMMING AMPLIFIER

[75] Inventor: Elwood C. Reichart, Chicago, Ill.
[73] Assignee: Motorola, Inc., Schaumburg, Ill.
[21] Appl. No.: 15,563
[22] Filed: Feb. 26, 1979

Related U.S. Application Data

[63] Continuation of Ser. No. 861,780, Dec. 19, 1977, abandoned.
[51] Int. Cl.³ .............................................. H03F 3/18
[52] U.S. Cl. .................................... 330/289; 330/69; 330/290; 330/293; 330/297; 330/311
[58] Field of Search ..................... 330/69, 70, 87, 252, 330/256, 288, 289, 290, 293, 297, 310, 311

[56] References Cited

U.S. PATENT DOCUMENTS

| | | | |
|---|---|---|---|
| 3,142,021 | 7/1964 | Stelmak | 330/310 X |
| 3,510,579 | 5/1970 | Marsh, Jr. | 330/289 X |
| 3,697,882 | 10/1972 | Van den Plassche | 330/257 X |
| 3,866,134 | 2/1975 | Higuchi et al. | 330/256 X |
| 3,996,462 | 12/1976 | Fletcher et al. | 330/288 X |

FOREIGN PATENT DOCUMENTS

| | | | |
|---|---|---|---|
| 2159095 | 5/1973 | Fed. Rep. of Germany | 330/254 |
| 840666 | 7/1960 | United Kingdom | 330/293 |

Primary Examiner—James B. Mullins
Attorney, Agent, or Firm—James A. Scheer; James W. Gillman

[57] ABSTRACT

A bipolar transistor is utilized as the feedback element of an inverting amplifier. The base of the transistor is connected to the amplifier's output, with the emitter connected to the input thereby providing 100% voltage feedback. The output is taken across the collector load of the transistor. Signal inputs to the amplifier are coupled through conventional summing resistors. The resulting configuration is capable of high frequency operation and provides excellent isolation between input signals.

7 Claims, 3 Drawing Figures

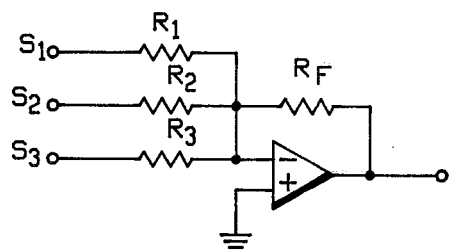
Fig. 1
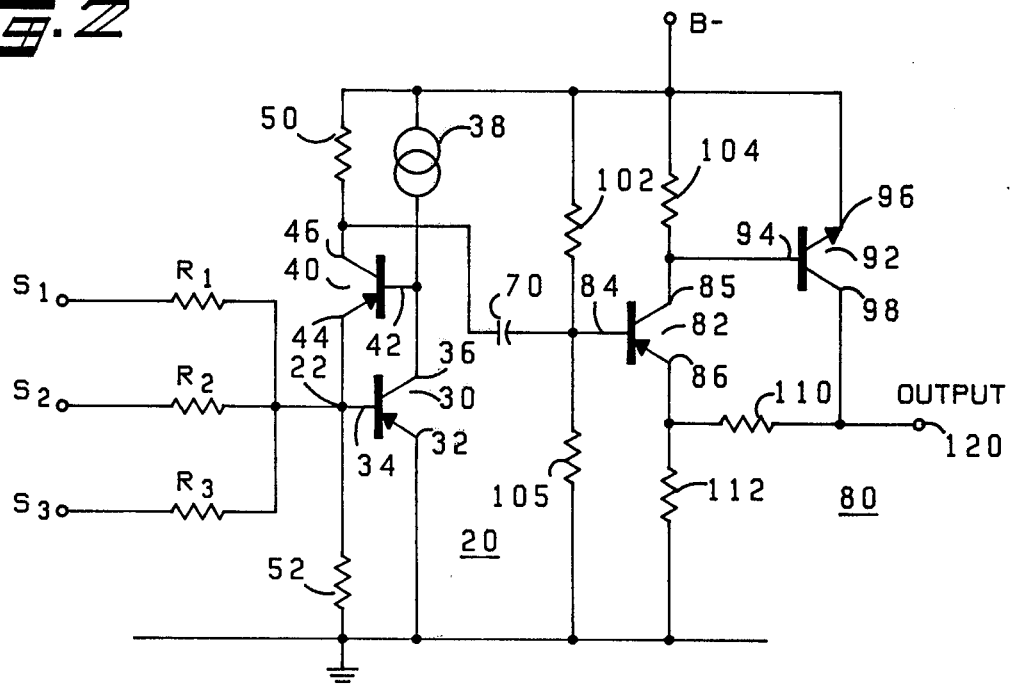
Fig. 2
Fig. 3

HIGH PERFORMANCE SUMMING AMPLIFIER

This is a continuation of application Ser. No. 861,780, filed Dec. 19, 1977, now abandoned.

BACKGROUND OF THE INVENTION

This invention pertains to the electronics art and, more particularly, to a high performance summing amplifier.

Summing amplifiers, are well known, particularly in the communication art. The function of a summer is to combine two or more signals thereby producing an output mixed signal.

FIG. 1 is a schematic diagram of a typical summer amplifier topology. Here, a plurality of signal sources S1-S3 are to be linearly summed in a proportion determined by input series resistors $R_1$–$R_3$, respectively. These signals are fed through summing resistors $R_1$–$R_3$ to the inverting input 12 of a high gain amplifier 10. The non-inverting input 14 of amplifier 10 is connected to ground potential. A feedback resistor $R_F$ couples from the output 16 of amplifier 10 to the inverting input 12. Ideally, the signal $S_{out}$ appearing at the output 16 of the summing amplifier is of the form:

$$S_{out} = -R_F \left[ \frac{S_1}{R_1} + \frac{S_2}{R_2} + \frac{S_3}{R_3} \right]$$

Also, under ideal conditions, inverting input 12 of amplifier 10 would be at virtual ground potential, whereby each of the signals $S_1$–$S_3$ would be isolated from all other signals, thereby eliminating the possibility of cross-talk or feed through.

Unfortunately, the summing amplifier designs known in the prior art have not realized ideal performance, particularly at high frequencies. Thus, the impedance at the inverting input of such prior art devices has not been maintainable at virtual ground thereby resulting a degraded isolation characteristic. In many applications, such as the transmission of multiple channels of information over a single channel, this isolation degradation cannot be tolerated.

SUMMARY OF THE INVENTION

It is an object of this invention, therefore, to provide an improved summing amplifier which exhibits excellent isolation characteristics even at high frequencies.

Briefly, according to the invention, an improved amplifier is comprised of a high gain amplifier which has an inverting input and an output connection. A three terminal semiconductor device, preferably a bipolar transistor, is provided, which device is coupled in feedback relation with the high gain amplifier. The control terminal of the device, or the base in the case of a semiconductor transistor, couples to the output of the high gain amplifier with the first terminal of the device, e.g. the emitter of a bipolar transistor, coupled to the inverting input of the high gain amplifier. An output load is provided in the third terminal of the device, this being the collector of a bipolar transistor. The improved amplifier can be combined in summing amplifier configuration by coupling input signals through summing resistors to the input of the high gain amplifier. The mixed output of the signals appears across the output load.

Due to the 100% voltage feedback provided by this design, the inverting input to the improved amplifier is maintained at a very low impedance, even at very high frequency.

BRIEF DESCRIPTION OF THE DRAWINGS

FIG. 1 illustrates a conventional summing amplifier configuration;

FIG. 2 is one preferred embodiment of a summing amplifier according to the invention; and FIG. 3 is an alternate preferred embodiment of the improved amplifier according to the invention.

DETAILED DESCRIPTION OF THE DRAWINGS

As discussed hereinabove, FIG. 1 illustrates a conventional summing amplifier. A plurality of signals, here signals $S_1$–$S_3$ are coupled through a series of coupling resistors $R_1$–$R_3$ to the inverting input 12 of a high gain amplifier 10. The non-inverting input 14 of amplifier 10 is connected to ground potential. Feedback from the output 16 of amplifier 10 is provided to the inverting input 12 by a feedback resistor $R_F$. The resulting gain of this configuration is given by the aforementioned formula, i.e.:

$$S_{out} = -R_F \left[ \frac{S_1}{R_1} + \frac{S_2}{R_2} + \frac{S_3}{R_3} \right]$$

If amplifier 10 exhibited perfect operating characteristics, that is an infinite open loop gain, an infinite input impedance and zero output impedance, independent of frequency, then inverting input 12 would be at virtual earth thereby perfectly isolating each of the signals $S_1$–$S_3$ from all other signals. Thus, there would be no cross-talk or feed through. In such circuits known to the prior art, however, such ideal characteristics are only realizable at relatively low frequencies, with high frequency operation resulting in intolerable cross-talk performance. The instant invention provides an excellent solution to this problem.

FIG. 2 illustrates, in schematic diagram form, one preferred embodiment of the generalized summing amplifier configuration shown in FIG. 1. Here, each of the signals to be summed, $S_1$–$S_3$. is coupled through a corresponding resistor, $R_1$–$R_3$, as in FIG. 1, to the input 22 of the improved amplifier 20.

Improved amplifier 20 includes a high voltage gain stage comprised of bipolar transistor 30, having its emitter 32 connected to ground potential, its base 34 connected to the input 22 of the improved amplifier 20 and its collector 36 coupled through a constant current source 38 to a source of negative DC potential B—. In the known manner, signals applied to the base input 34 are inverted and voltage amplified by a large factor, appearing at the collector 36 output.

Feedback from the output to input of high gain stage 30 is provided by bipolar transistor 40. The base 42 of transistor 40 connects to the collector 36 of gain stage 30, with the emitter 44 of transistor 42 being directly connected to the base 34 of stage 30. Thus, transistor 40 in FIG. 2 corresponds to the feedback resistor $R_F$ of FIG. 1. The collector 46 of transistor 40 couples through an output load resistor 50 to the source of negative bias potential B—.

Because transistor 40 has a relatively low AC impedance from its base 42 to its emitter 44, virtually the entire signal appearing at the collector 36 of amplifying stage 30 is fed back to its base 34. This feedback current creates a corresponding current through the collector 46 of feedback transistor 40, whereby the AC signal appears across load resistor 50. To increase the current through feedback transistor 40, thereby optimizing its performance characteristics, a current source resistor 52 is connected from the emitter 44 of transistor 40 to ground potential.

Due to the fact that the open loop gain of amplifying stage 30 is very high, and to the fact that 100% voltage feedback is provided to feedback transistor 40 from the collector 36 to the base 34 of stage 30, the impedance at the input 22 of the improved amplifier 20 is maintained at, or near, virtual ground. Also, due to the 100% feedback, the AC signal swing at the collector 36 of transistor 30 is very small. Thus, frequency roll-off effects, such as Miller capacity or parametrics is kept at an absolute minimum and the transistor exhibits excellent high frequency amplification. Due to the excellent high frequency open loop gain exhibited by this configuration, the virtual ground at the improved amplifier input 22 is maintained even at very high frequencies, whereby the input signals $S_1$-$S_3$ are highly isolated one from the other.

The output signal taken at the collector 46 of feedback transistor 40 is AC coupled through capacitor 70 to a voltage amplifying stage 80. Amplifying stage 80 is comprised of cascade transistors 82, 92, respectively. The base 84 of transistor 82 is DC biased by a voltage divider comprised of resistors 102, 105. The collector 85 of transistor 82 has a load resistor 104 which is across the base to emitter junction, 94, 96 of transistor 92. Feedback is taken from the collector 98 of transistor 92 to the emitter 86 of transistor 82 via feedback resistor 110. The emitter 86 of transistor 82 is also taken to ground potential through the emitter resistor 112. Thus output amplifier 80 exhibits a very high open loop gain and a closed loop gain equal to 1 + the ratio of resistor 110 to resistor 112. Thus, the mixed signal appearing at the collector 46 of feedback transistor 40 is amplified through amplifier 80 appearing at an output 120.

FIG. 3 is an alternate preferred embodiment of the improved amplifier according to the invention. Here, as with FIGS. 1 and 2, the signals to be summed $S_1$-$S_3$ are coupled through respective summing resistors $R_1$-$R_3$ to the input, here 122, of the inverting amplifier. In this embodiment of the invention, just as in FIG. 2, a high gain stage is formed by an input transistor 130 having its base 134 connected to the input 122 of the amplifier. The emitter 132 of transistor 130 couples through a current source resistor 160 to ground potential. A bipolar transistor 170 is connected in differential amplifier configuration with transistor 130 thereby providing temperature compensation to transistor 130 in the normal manner. A bypass capacitor 172 bypasses current source resistor 160, thereby improving the AC gain of amplifier 130.

The collector 136 of transistor 130 is coupled through a constant current source 138 to the source of negative DC bias, B−. Here, constant current source 138 is comprised of NPN bipolar transistor 180 which has its collector 182 connected to the collector 136 of transistor 30, its base 184 connected to a source of DC bias, suitably bypassed by a capacitor 192, and its emitter 186 coupled through current determining resistor 194 to the source of DC bias. In the known manner, with a fixed DC voltage applied across the base emitter junction of transistor 180, a constant current will be supplied through its collector 182 to transistor 130.

Feedback is provided from the collector 136 to the base 134 of transistor 130 via the base 142, emitter 144 terminals of feedback transistor 140. A current source to transistor 140 is provided by current source resistor 152.

The principle difference between the embodiment of FIG. 3 and that of FIG. 2 is the use of a cascode amplifier stage 200 comprised of cascode connected PNP transistor 210. In the known manner of cascode amplifiers, the emitter 212 of transistor 210 is connected to the collector 146 of transistor 140, and its base 214 is coupled to a fixed DC bias. The collector 216 of cascode stage 210 is coupled through a load resistor 250 to the source of negative DC bias.

The advantage realized by the preferred embodiment of FIG. 3 is further enhanced high frequency performance over the embodiment of FIG. 2. This is a result of the fact that, due to cascode stage 200, there is virtually no AC signal appearing at the collector of feedback transistor 140. Thus, there is minimum high frequency degradation of the gain of transistor stage 140 due to the Miller effect and parametrics. Thus, this stage maintains high gain characteristics at very high frequencies thereby assuring that the input 122 to the summing amplifier is maintained at, or very close to, ground potential. As with the embodiment of FIG. 2, the output is taken across load resistor, here resistor 250.

Thus, the embodiment of FIG. 3 exhibits even superior high frequency performance to the embodiment of FIG. 2 as well as temperature stabilization due to the differential configuration including transistor 170.

As one further point, although one of ordinary skill in the art would have no trouble selecting the various components used in a preferred embodiments of the invention shown in FIGS. 2 and 3, it is preferred that a Darlington transistor be used as the feedback transistor 40, 140, respectively. This, because otherwise there may be some loading of the constant current source 38, 138 in the collectors 36, 136 of the high gain stages, thereby reducing open loop gain.

While a preferred embodiment of the invention has been described in detail, it should be apparent to one of ordinary skill in the art that many modifications and variations thereto are possible, all of which fall within the true spirit and scope of the invention.

I claim:
1. An improved amplifier comprising:
a high gain amplifier means having an inverting input, an output, a ground, and an output load substantially comprising a constant current source;
a three terminal gain device having first and second terminals and a control terminal, said device having a relatively low a.c. impedance from the control terminal to the first terminal and a relatively high impedance from the control terminal to the second terminal;
output load means comprised of a cascode connected active gain device in series with a passive load means;
means for coupling said control terminal to the output of said high gain amplifier;
means for directly connecting said first terminal to the input of said high gain amplifier;
current source resistance connected from the input of said high gain amplifier to the ground; and means for coupling said second terminal to the load means, whereby the input to the high gain amplifier comprises the input to said improved amplifier and the output of said improved amplifier is taken across said passive load means.

2. The improved amplifier of claim 1 wherein said three terminal gain device is comprised of a bipolar transistor having base, emitter and collector terminals corresponding to said control, first and second terminals, respectively.

3. The improved amplifier of claim 2 wherein said high gain amplifier means is comprised of a bipolar transistor device having its base coupled to said inverting input and its collector coupled to said high gain amplifier means output.

4. The improved amplifier of claim 3 further comprising a second bipolar transistor coupled in circuit configuration with said bipolar transistor device to temperature compensate the same.

5. The improved amplifier of claim 1 wherein said high gain amplifier means is comprised of a first bipolar transistor having its base coupled to said inverting input and its collector coupled to said high gain amplifier means output.

6. The improved amplifier of claim 4 further comprising a second bipolar transistor having only its emitter coupled to said first bipolar transistor to form a differential amplifier configuration with said first bipolar transistor to temperature compensate the same.

7. The improved amplifier of claim 1 in combination with a plurality of summing resistors coupled to the input thereof, said improved amplifier mixing signals applied through said summing resistors and producing the summed signal at its output terminal.

* * * * *